(12) United States Patent
Kim

(10) Patent No.: US 9,299,588 B2
(45) Date of Patent: Mar. 29, 2016

(54) METHOD OF MANUFACTURING LEAD FRAME

(71) Applicant: HAESUNG DS CO., LTD., Changwon-Si (KR)

(72) Inventor: Jeung-Il Kim, Changwon-si (KR)

(73) Assignee: HAESUNG DS CO., LTD, Changwon-si (KR)

( * ) Notice: Subject to any disclaimer, the term of this patent is extended or adjusted under 35 U.S.C. 154(b) by 124 days.

(21) Appl. No.: 14/182,783

(22) Filed: Feb. 18, 2014

(65) Prior Publication Data

US 2014/0329360 A1      Nov. 6, 2014

(30) Foreign Application Priority Data

May 6, 2013   (KR) .................. 10-2013-0050810

(51) Int. Cl.
| | | |
|---|---|---|
| *H01L 21/00* | (2006.01) | |
| *H01L 21/48* | (2006.01) | |
| *H01L 23/495* | (2006.01) | |
| *H01L 23/31* | (2006.01) | |

(52) U.S. Cl.
CPC ...... *H01L 21/4842* (2013.01); *H01L 23/49541* (2013.01); *H01L 23/49548* (2013.01); *H01L 23/49582* (2013.01); *H01L 23/3107* (2013.01); *H01L 2224/48247* (2013.01)

(58) Field of Classification Search
USPC .................................. 257/670, 676; 438/123
See application file for complete search history.

(56) References Cited

U.S. PATENT DOCUMENTS

| | | | |
|---|---|---|---|
| 8,072,050 B1* | 12/2011 | Karim et al. .............. 257/666 |
| 2009/0315159 A1* | 12/2009 | Abbott .................... 257/666 |

FOREIGN PATENT DOCUMENTS

| | | |
|---|---|---|
| JP | 9-307043 A | 11/1997 |
| JP | 10-56118 A | 2/1998 |
| KR | 10-2009-0076618 A | 7/2009 |
| KR | 10-2011-0021407 A | 3/2011 |

* cited by examiner

*Primary Examiner* — Errol Fernandes
(74) *Attorney, Agent, or Firm* — Sughrue Mion, PLLC

(57) ABSTRACT

There is provided a method of manufacturing a lead frame, the method including: preparing a lead frame raw material; forming openings in the lead frame raw material so that the lead frame material includes: a die pad; a die pad supporting portion supporting the die pad; a rail portion supporting the die pad supporting portion; a lead supporting portion having both ends fixed to the die pad supporting portion; and a plurality of leads having a first end connected to the rail portion and a second end connected to the lead supporting portion; plating the lead frame raw material having the openings with a plating layer; and removing the lead supporting portion.

5 Claims, 8 Drawing Sheets

METHOD OF MANUFACTURING LEAD FRAME

CROSS-REFERENCE TO RELATED APPLICATION

This application claims priority from Korean Patent Application No. 10-2013-0050810, filed on May 6, 2013, in the Korean Intellectual Property Office, the disclosure of which is incorporated herein by reference in its entirety.

BACKGROUND

1. Field

Methods consistent with exemplary embodiments relate to manufacturing a lead frame, and more particularly, to manufacturing a lead frame to maintain placements of leads during the manufacturing process.

2. Description of the Related Art

Along with semiconductor chips, lead frames are one of the main elements in a semiconductor package. Lead frames function not only as a lead for connecting the inner portion and outer portion of the semiconductor package, but also as a frame for supporting the semiconductor chips. The lead frames may be manufactured in various forms.

In the related art, a lead frame includes a die pad and a plurality of leads. Openings are formed between the die pad and a lead, and between the plurality of leads.

Such openings prevent the leads and the die pad from being directly electrically connected, and prevent each of the leads from being electrically connected from one another. In particular, via the openings between the lead and the die pad, the semiconductor chips disposed on the die pad may be wire bonded to an inner lead, and thus may be connected thereto.

In the related art, methods of forming the opening of the lead frame are classified into a stamping method or an etching method. The stamping method is a press working method in which a progressive press apparatus sequentially transfers and then punches a material so that a product having a predetermined shape is manufactured. The stamping method is usually used for mass production of lead frames that do not have many leads.

Alternatively, a method of forming an opening in a lead frame by using the etching method may be used as disclosed in Korean Patent Publication No. 10-2002-0062518.

SUMMARY

One or more exemplary embodiments provide a method of manufacturing a lead frame.

According to an aspect of an exemplary embodiment, there is provided a method of manufacturing a lead frame, the method including: preparing a lead frame raw material; forming openings in the lead frame raw material so that the lead frame material includes: a die pad; a die pad supporting portion supporting the die pad; a rail portion supporting the die pad supporting portion; a lead supporting portion having both ends fixed to the die pad supporting portion; and a plurality of leads having a first end connected to the rail portion and a second end connected to the lead supporting portion; plating the lead frame raw material having the openings with a plating layer; and removing the lead supporting portion.

The plating the lead frame raw material may include plating the lead frame raw material having the openings.

The removing the lead supporting portion may include removing the lead supporting portion after the forming and the plating.

The removing the lead supporting portion may include press shearing the lead supporting portion from the lead frame raw material.

The openings may be formed by etching.

The method may further include forming half etching portions on a surface of the lead frame raw material.

The removing the lead supporting portion may include pressing the lead frame raw material by a press working unit, the press working unit may include: a punch configured to move in a straight line; and a die configured to support the lead frame raw material, and wherein in the removing the lead supporting portion may include: moving the punch from an opposite surface of the surface having the half etching portions towards the surface having the half etching portions; and removing the lead supporting portion.

The die may include a step portion.

The removing the lead supporting portion may include pressing the lead frame raw material by a press working unit, wherein the press working unit may include: a punch configured to move in a straight line; and a die configured to support the lead frame raw material, and wherein the removing the lead supporting portion may include: moving the punch from the surface having the half etching portions towards an opposite surface of the surface having the half etching portions; and removing the lead supporting portion.

The die comprises a step portion.

The removing the lead supporting portion may include pressing the lead frame raw material by a press working unit, and wherein the press working unit may include: a punch configured to move in a straight line; and a die configured to support the lead frame raw material.

The method may further include cutting the lead frame raw material into strips after the removing the lead supporting portion.

The removing the lead supporting portion may include simultaneously removing the lead supporting portion and cutting the lead frame raw material into strips.

The method may further include transferring the lead frame raw material according to a roll-to-roll process.

The method may further include transferring the lead frame raw material according to a sheet-to-sheet process.

The method may further include transferring the lead frame raw material according to a strip-to-strip process.

The method may further include applying the lead frame raw material to a quad-flat no-leads (QFN) package.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Figure 1:
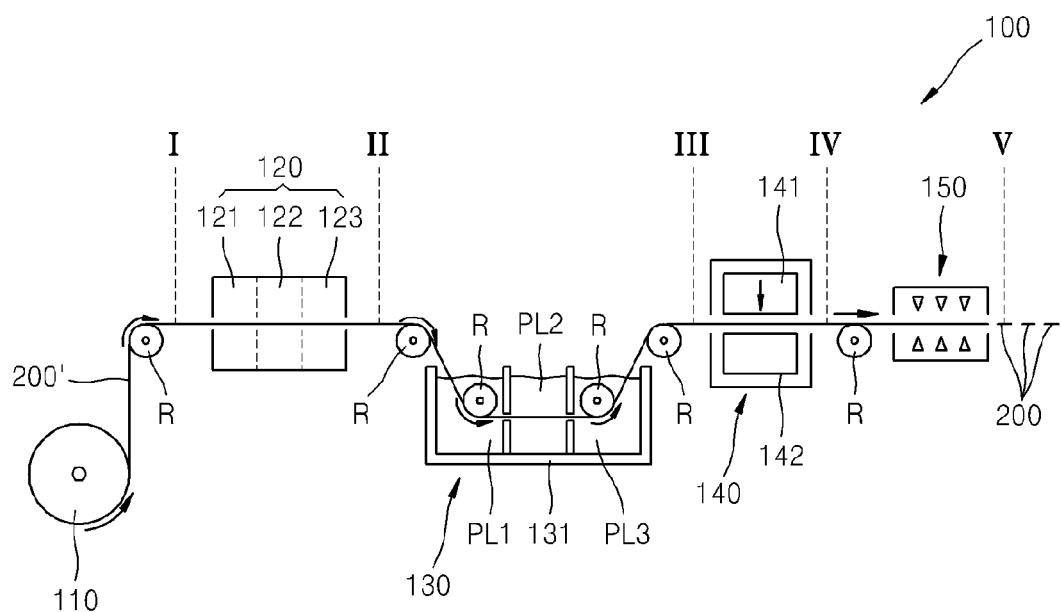
FIG. 1 is a view schematically illustrating a process of manufacturing a lead frame by using a lead frame manufacturing apparatus according to an exemplary embodiment.

Reference will now be made in detail to exemplary embodiments, examples of which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects of the present description.

Figure 2:
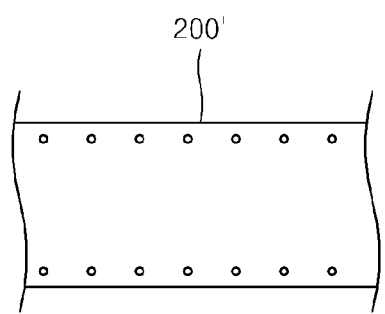
FIG. 2 is a plan view schematically illustrating a lead frame raw material at a point I of FIG. 1 according to an exemplary embodiment.

FIG. 1 is a view schematically illustrating a process of manufacturing a lead frame 200 by using a lead frame manufacturing apparatus 100 according to an exemplary embodiment. FIG. 2 is a plan view schematically illustrating a lead frame raw material 200' at a point I of FIG. 1.

Figure 7:
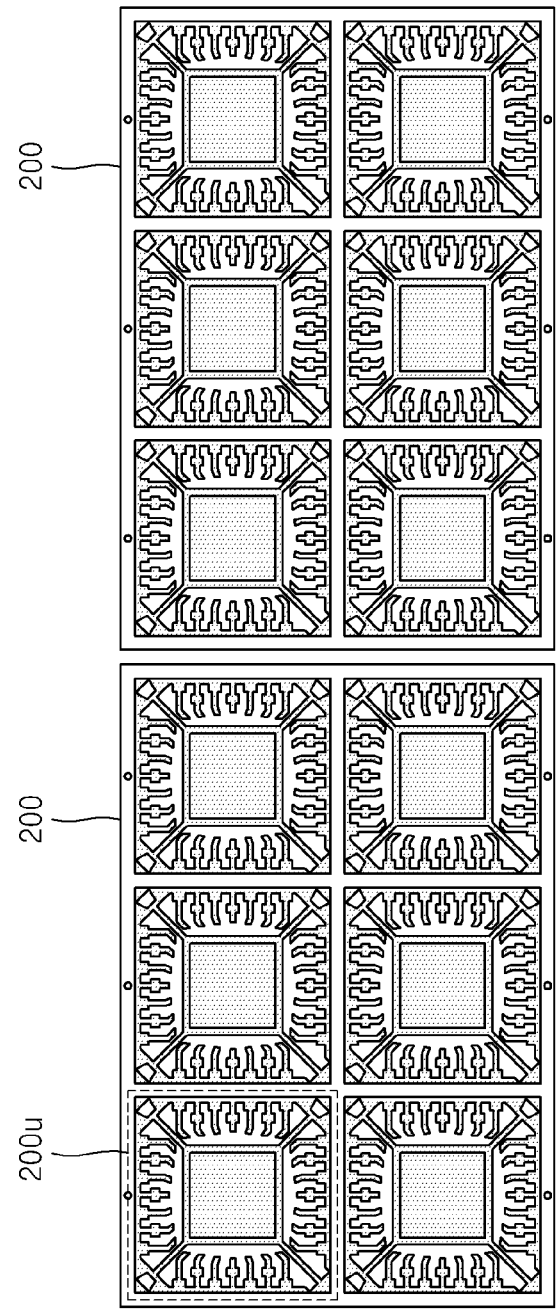
FIG. 7 is a plan view schematically illustrating the lead frame having a strip shape at a point V of FIG. 1 according to an exemplary embodiment.

As illustrated in FIG. 1, the lead frame manufacturing apparatus 100 according to an exemplary embodiment transfers the lead frame raw material 200' according to a roll-to-roll process, and manufactures the lead frame 200 having a strip shape as shown in FIG. 7.

The lead frame manufacturing apparatus 100 includes a raw material supplying roll 110, a shape forming unit 120, a plating layer forming unit 130, a press working unit 140, a strip cutting unit 150, and a plurality of transfer rollers R.

The lead frame 200 that is manufactured by the lead frame manufacturing apparatus 100 according to the exemplary embodiment includes a plurality of completed units 200u that are dual-row lead frames. However, the lead frame 200 is not limited thereto, and may include the completed units 200u that are single-row lead frames or multi-row lead frames having at least three rows of lead frames.

The lead frame manufacturing apparatus 100 according to the present exemplary embodiment transfers the lead frame raw material 200' according to the roll-to-roll process, and forms the lead frame 200 having the strip shape according to a series of processes which will be described in more detail below. However, the lead frame manufacturing apparatus 100 is not limited thereto. For example, according to one or more exemplary embodiments, when the lead frame raw material 200' has a panel shape, the lead frame manufacturing apparatus 100 may transfer the lead frame raw material 200' by using a conveyer transfer method, and may form the lead frame 200 according to a series of processes. Alternatively, the lead frame 200 may be manufactured by forming a plurality of strips into a sheet, and then transferring sheets to form the lead frame 200, i.e., a sheet-to-sheet process; or, by dividing the lead frame raw material 200' into strips, and then, transferring separate strips to form the lead frame 200, i.e., a strip-to-strip process.

The raw material supplying roll 110 of the lead frame manufacturing apparatus 100 of FIG. 1 supplies the lead frame raw material 200'. The raw material supplying roll 110 is formed in a cylindrical shape. The lead frame raw material 200', in which openings C are not formed, is wound a predetermined number of times around the raw material supplying roll 110.

The lead frame raw material 200' that is unwound from the raw material supplying roll 110 is flexible.

The lead frame raw material 200' that is unwound from the raw material supplying roll 110 may be a metal that is generally used in lead frame manufacturing, such as steel, nickel (Ni), alloy 42, copper (Cu), and Cu alloy.

The shape forming unit 120 is an apparatus for forming an overall shape of the lead frame 200 by performing an etching process to form the openings C in the lead frame raw material 200' so that each in-process unit 200u' of the lead frame raw material 200' includes a die pad 210, a die pad supporting unit 220 that supports the die pad 210, a rail unit 230 that supports the die pad supporting unit 220, a plurality of leads 240 whose ends are connected to the rail unit 230, and a lead supporting unit 250 whose both ends are fixed to the die pad supporting unit 220 and which connects to the leads 240. Although the openings C are formed through an etching process by the shape forming unit 120 according to the present exemplary embodiment, the inventive concept is not limited thereto. The openings C may be formed through a process and/or by an apparatus different from the etching process and/or the shape forming unit 120, respectively, according to another exemplary embodiment.

The shape forming unit 120 includes a coating apparatus 121 which coats a photosensitive material on the lead frame raw material 200'; a pattern forming apparatus 122 which forms an etching resist pattern according to a photolithography process that includes an exposure process and a developing process, and an etching apparatus 123 which forms respective shapes of the openings C, half etching portions BH, and the like by etching process using the formed etching resist pattern. Since the above apparatuses 121, 122 and 123 may be apparatuses that are well-known to one of ordinary skill in the art, the detailed description thereof are omitted.

Figure 3A:
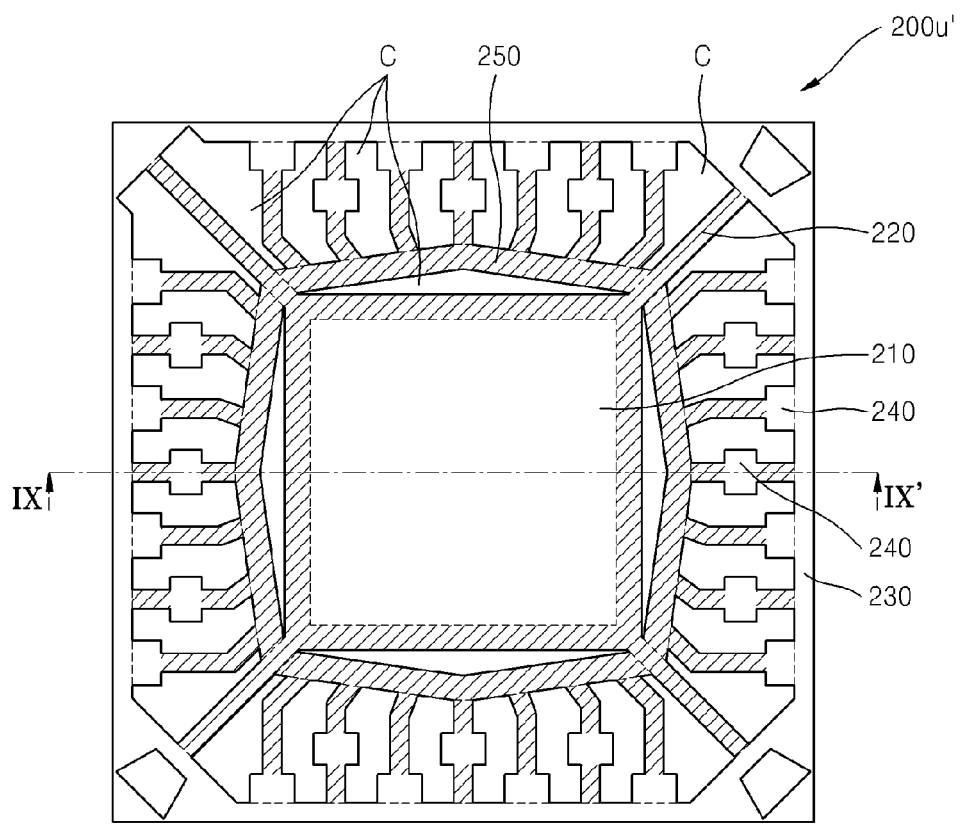
FIG. 3A is a plan view schematically illustrating a unit of the lead frame raw material at a point II of FIG. 1 according to an exemplary embodiment.
Figure 3B:
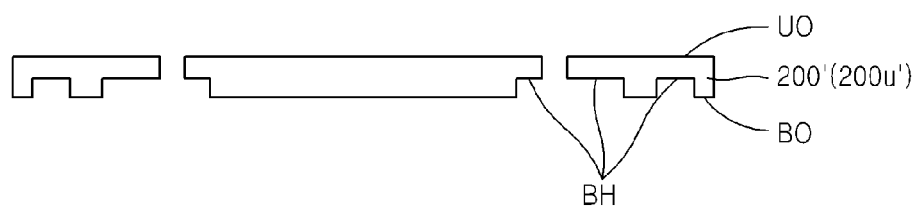
FIG. 3B is a cross-sectional view schematically illustrating the unit of the lead frame raw material that is cut along a line IX-IX' of FIG. 3A according to an exemplary embodiment.

As illustrated in FIGS. 3A and 3B, when the lead frame raw material 200' passes through the shape forming unit 120, the in-process unit 200u' of the lead frame raw material 200' includes the die pad 210, the die pad supporting unit 220, the rail unit 230, the leads 240, the lead supporting unit 250, the openings C, and the half etching portions BH.

The shape forming unit 120 according to the exemplary embodiment not only forms the openings C, but also forms the half etching portions BH by half-etching a portion of the lead frame raw material 200' on a, but is not limited thereto. That is, the shape forming unit 120 according to one or more exemplary embodiments may not form the half etching portions BH. In that case, the die pad 210, the die pad supporting unit 220, the rail unit 230, the leads 240, and the lead supporting unit 250, which form the in-process unit 200u' of the lead frame raw material 200', may all have the same thickness.

The plating layer forming unit 130 performs electroplating while the lead frame raw material 200' that is transferred is dipped in plating solutions PL1, PL2, and PL3 which are used in performing pre-plated lead frame plating (PPF plating). As a result, a plating layer 260 is formed completely on both surfaces (i.e. a lower surface BO and an upper surface UO) of the lead frame raw material 200' as shown in FIG. 4B. To form the plating layer 260 as described, the plating layer forming unit 130 includes a plating solution accommodation unit 131. The plating solution accommodation unit 131 may include three containers, and the containers may respectively accommodate the plating solutions PL1, PL2, and PL3 (such as Ni solution, palladium (Pd) solution, and gold (Au) solution) which are used in performing the PPF plating. The lead frame raw material 200' may sequentially pass through a plurality of plating solution containers, and thus be plated. As the lead frame raw material 200' is dipped in the plating solutions, a plurality of plating layers may be sequentially stacked, and thus form the plating layer 260.

The plating layer forming unit 130 according to the exemplary embodiment performs the PPF plating on both surfaces of the lead frame raw material 200'. However, the plating layer forming unit 130 is not limited thereto, and may form a plating layer only on one surface of the lead frame raw material 200'. In this case, the plating solution may include silver (Ag).

The plating layer forming unit 130 according to the exemplary embodiment includes the plating solution accommodation unit 131, and performs electroplating by using the plating solutions PL1, PL2, and PL3 that are accommodated in the plating solution accommodation unit 131. However, the plating layer forming unit 130 is not limited thereto, and may be an apparatus that performs selective electroplating. In this case, the plating layer forming unit 130 may use a masking tool to perform selective plating on a predetermined location, while maintaining a plating thickness and surface brilliance that are determined according to a designer's standard. That is, the plating layer forming unit 130 according to one or more exemplary embodiments may selectively form the plating layer 260 only on a portion of a surface of the lead frame raw material 200'.

According to the exemplary embodiment, the plating layer forming unit 130 is an apparatus that performs electroplating, but is not limited thereto. That is, the plating layer forming unit 130 according to one or more exemplary embodiments may be an apparatus that performs electroless plating.

The press working unit 140 is an apparatus that removes the lead supporting unit 250 of the in-process unit 200u' of the lead frame raw material 200' by press working after passing through the plating layer forming unit 130.

The press working unit 140 includes a punch 141 moving back and forth in a straight line towards and away respectively from the lead frame raw material 200', a die 142 and a fixing member 143 supporting and fixing the lead frame raw material 200' when press working.

The press working unit 140 according to the exemplary embodiment includes the fixing member 143, but is not limited thereto, and may not include the fixing member 143. In this case, a groove may be formed in the die 142 so that the lead frame raw material 200' may be fixed in the groove.

In the press working unit 140, when the lead frame raw material 200' is supported and fixed by using the die 142 and the fixing member 143, the punch 141 descends and performs press shearing to remove the lead supporting unit 250. The punch 141 and the die 142 are designed to have shapes such that the lead supporting unit 250 may be removed.

The press working unit 140 according to the exemplary embodiment is designed to remove only the lead supporting unit 250, but is not limited thereto, and may be designed to perform a process for cutting the lead frame raw material 200' into strips.

The strip cutting unit 150 is an apparatus for cutting the lead frame raw material 200' into strips by press working or sawing, and thus forming the lead frames 200 having the strip shape. As illustrated in FIG. 7, the lead frame 200 that is formed by the strip cutting unit 150 includes the plurality of completed units 200u. Each of the completed units 200u may be used in a single semiconductor chip package.

The lead frame manufacturing apparatus 100 according to the exemplary embodiment includes the strip cutting unit 150, but is not limited thereto. That is, the lead frame manufacturing apparatus 100 according to one or more exemplary embodiments may not include the strip cutting unit 150. For example, as described above, when the press working unit 140 is designed to perform the process of cutting the lead frame raw material 200' into strips, the lead frame manufacturing apparatus 100 may not include the strip cutting unit 150.

Figure 8:
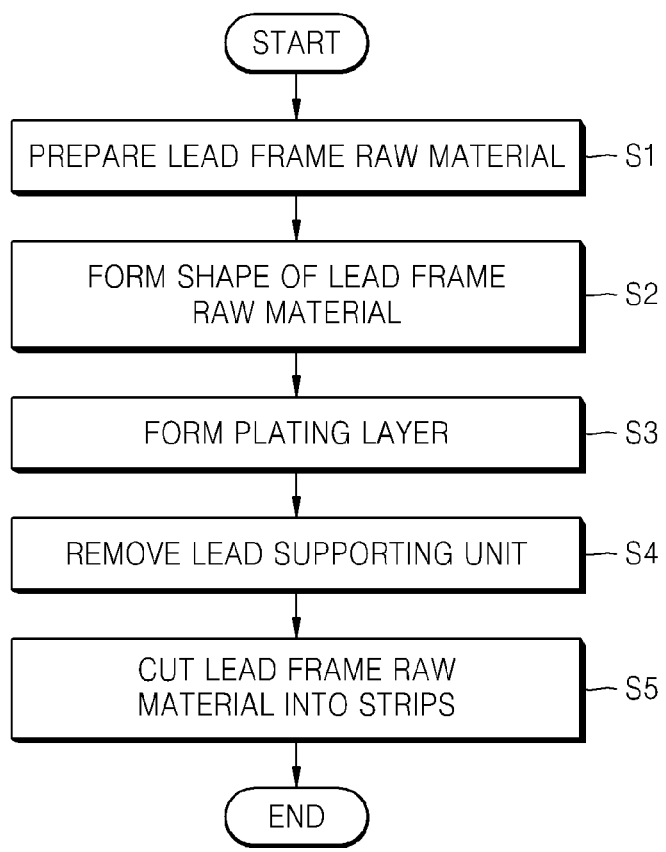
FIG. 8 is a flowchart schematically illustrating the method of manufacturing the lead frame according to an exemplary embodiment.

Hereinafter, with reference to FIGS. 1 to 8, the process of manufacturing the lead frame 200 by using the above described lead frame manufacturing apparatus 100 will be described. FIG. 8 is a flowchart schematically illustrating the method of manufacturing the lead frame 200 according to an exemplary embodiment.

First, a manufacturer prepares the lead frame raw material 200' by winding a roll of the lead frame raw material 200' on the raw material supplying roll 110, and as illustrated in FIG. 1, sets the raw material supplying roll 110 on the lead frame manufacturing apparatus 100 (operation S1).

In FIG. 2, the lead frame raw material 200' at the point I (refer to FIG. 1) between the raw material supplying roll 110 and the shape forming unit 120 is illustrated.

Next, as the raw material supplying roll 110 rotates, the lead frame raw material 200' is unwound and then is transferred to the shape forming unit 120.

The shape forming unit 120 performs the etching process to form the openings C and the half etching portions BH in the lead frame raw material 200' so that the in-process unit 200u' of the lead frame raw material 200' includes the die pad 210, the die pad supporting unit 220 that supports the die pad 210, the rail unit 230 that supports the die pad supporting unit 220, the plurality of leads 240 having an end connected to the rail unit 230, and the lead supporting unit 250 where both ends of the lead supporting units are fixed to the die pad supporting unit 220 and connects another end of the leads 240 (operation S2).

That is, the lead frame raw material 200' that is transferred to the shape forming unit 120 sequentially passes through the coating apparatus 121 for coating the photosensitive material on the lead frame raw material 200' the pattern forming apparatus 122 for forming the etching resist pattern (for example, the etching resist pattern may be formed by using dry film photoresist (DFR)) according to the photolithography process that includes the exposure process and the developing process; and the etching apparatus 123 for etching the lead frame raw material 200' by using the formed etching resist pattern. Thus, the openings C and the half etching portions BH are formed in the each in-process unit 200u' of the lead frame raw material 200'.

In this case, the half etching portions BH are formed on a portion of the lower surface BO of the in-process unit 200u' of the lead frame raw material 200'. As illustrated in FIG. 3A, the portion of the power surface BO corresponds to an etching area of the in-process unit 200u'. That is, since FIG. 3A is illustrating an upper surface UO of the in-process unit 200u' of the lead frame raw material 200', the etching area corresponds to the portion of the lower surface BO of the in-process unit 200u' of the lead frame raw material 200'. In detail, referring to FIG. 9, the portion of the lower surface BO on which the half etching portions BH is formed, may be a portion other than a portion to which conductive wires 320, which are electrically connected to a semiconductor chip, are connected such as an inner portion of the die pad 210 and the rail unit 230.

When the half etching portions BH is formed, the processing the lead frame raw material 200' may be easily and precisely conducted. Thus, a degree of precision of the lead frame 200 may increase, and manufacturing costs may be reduced. Also, when the plating layer 260 is formed only on a surface of the lead frame raw material 200' opposite of a surface where the half etching portions BH is formed by using the plating solution including Ag, an Ag back flash during a plating process is reduced in the half etching portions BH that is formed on an opposite surface of the surface on which the plating layer 260 is formed. Therefore, the quality of the lead frame 200 is more reliably maintained due to the half etching portions BH.

According to the exemplary embodiment, the half etching portions BH is formed on the portion of the lower surface BO of the in-process unit 200u' of the lead frame raw material 200', but is not limited thereto. The half etching portions BH may be formed on a portion of the upper surface UO of the in-process unit 200u' of the lead frame raw material 200'.

FIG. 3A illustrates the in-process unit 200u' of the lead frame raw material 200' at a point II (refer to FIG. 1), which has passed through the shape forming unit 120. In FIG. 3A, the in-process unit 200u' of the lead frame raw material 200' at a point II includes the die pad 210, the die pad supporting unit 220, the rail unit 230, the plurality of leads 240, the lead supporting unit 250, and the openings C. Also, FIG. 3B is a cross-sectional view schematically illustrating the in-process unit 200u' that is cut along a line IX-IX' of FIG. 3A. In FIG. 3B, the half etching portions BH which is formed by half-etching the portion of the lower surface BO of the in-process unit 200u' of the lead frame raw material 200' is illustrated.

According to the exemplary embodiment, operation S2 further includes, forming the openings C, and half-etching the portion of the lower surface BO of the lead frame raw material 200'. However, operation S2 is not limited thereto, and may not include the half-etching of the portion of the lead frame raw material 200'.

Next, after passing through the forming of the openings C and the half-etching by the shape forming unit 120, the lead frame raw material 200' is transferred to the plating layer forming unit 130. The plating layer forming unit 130 performs electroplating to form the plating layer 260 on the surface of the lead frame raw material 200' (operation S3).

Figure 4A:
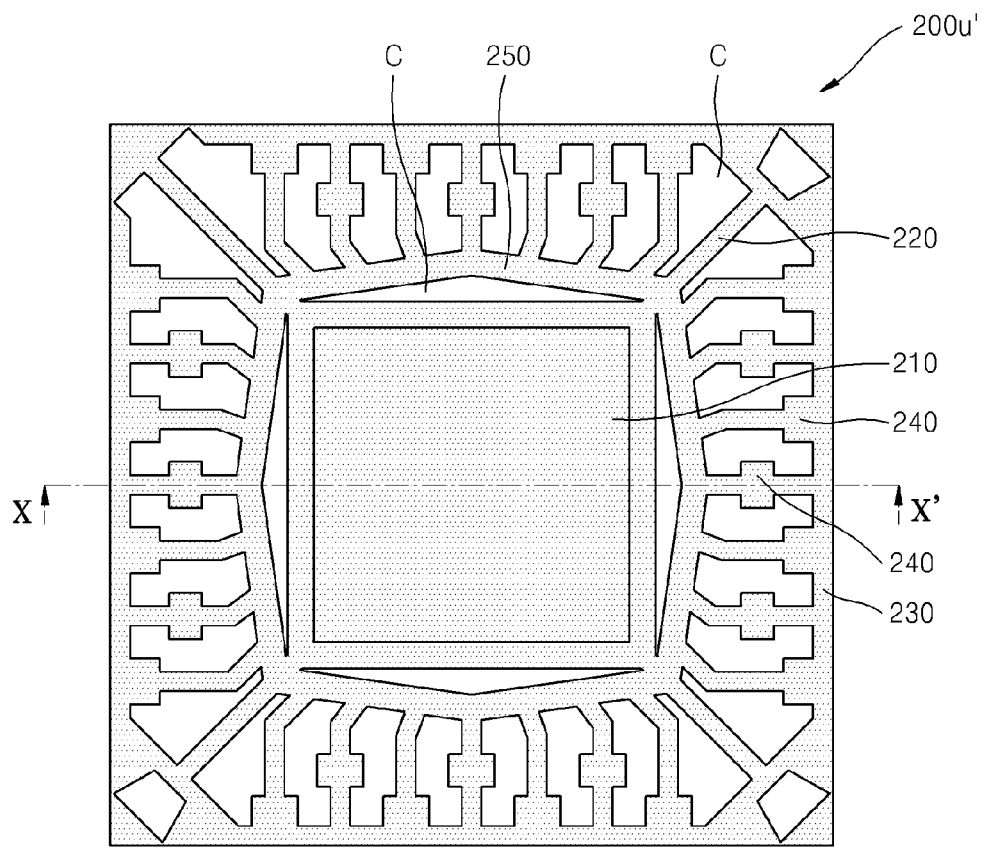
FIG. 4A is a plan view schematically illustrating the unit of the lead frame raw material at a point III of FIG. 1 according to an exemplary embodiment.
Figure 4B:
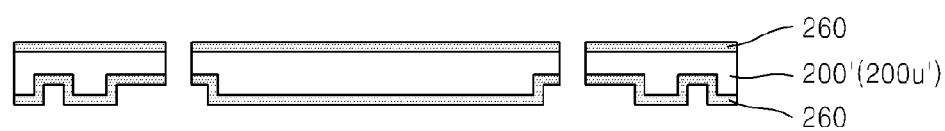
FIG. 4B is a cross-sectional view schematically illustrating the unit of the lead frame raw material that is cut along a line X-X' of FIG. 4A according to an exemplary embodiment.

FIG. 4A is a plan view schematically illustrating the unit 200' of the lead frame raw material 200' at a point III of FIG. 1 between the plating layer forming unit 130 and the press working unit 140. FIG. 4B is a cross-sectional view schematically illustrating the in-process unit 200u' that is cut along a line X-X' of FIG. 4A. In FIG. 4A, the plating layer 260 on a front surface of the lead frame raw material 200' is shown by using a dotted pattern. In FIG. 4B, the plating layer 260 is formed on both surfaces of the lead frame raw material 200' at the point III of FIG. 1.

Next, after passing through the forming of the plating layer 260 by the plating layer forming unit 130, the lead frame raw material 200' is transferred to the press working unit 140. The press working unit 140 removes the lead supporting unit 250 by press working, or stamping (operation S4). That is, as illustrated in FIGS. 1, 5A and 5B, the punch 141 of the press working unit 140 descends, punches the lead frame raw material 200' that is fixed by the die 142 and the fixing member 143, and thus removes the lead supporting unit 250.

The punch 141 punches out the lead supporting unit 250 while moving from the upper surface UO towards the lower surface BO of the lead frame raw material 200'. Since the half etching portions BH are formed on the lower surface BO, the lead frame raw material 200' may be less susceptible to transformation when a pressing process is performed from the upper surface UO towards the lower surface BO.

According to the exemplary embodiment, the punch 141 punches out the lead supporting unit 250 while moving from the upper surface UO to the lower surface BO of the lead frame raw material 200'. However, the movement of the punch 141 is not limited thereto, and the punch 141 may punch from the lower surface BO towards the upper surface UO of the lead frame raw material 200'. In this case, the punch 141 performs the pressing process from the lower surface BO on which the half etching portions BH is formed to the upper surface UO on which the half etching portions BH is not formed. In this case, the lead frame raw material 200' may be formed by using a material that is less modifiable.

Figure 5A:
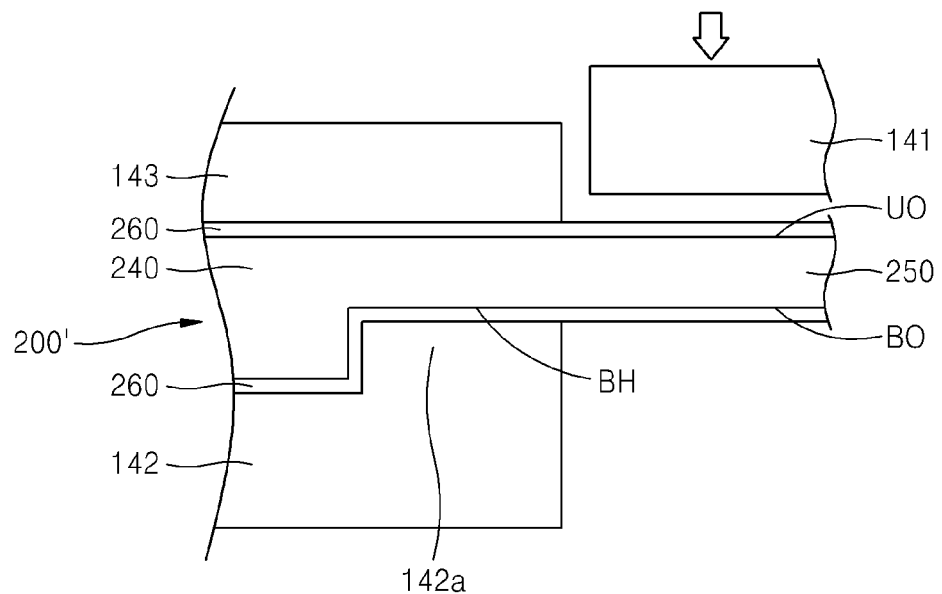
FIG. 5A is a view schematically illustrating a punch that is moving in a direction of the lead frame raw material, in a press working unit according to an exemplary embodiment.
Figure 5B:
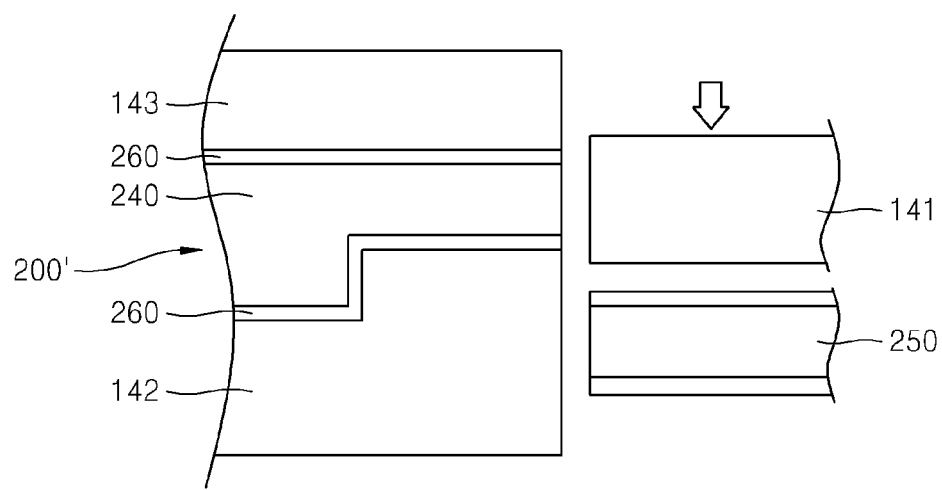
FIG. 5B is a view schematically illustrating a moment when the punch punches the lead frame raw material so that a lead supporting unit is removed, in the press working unit according to an exemplary embodiment.

FIG. 5A is a view schematically illustrating the punch 141 that is moving in a direction towards the lead frame raw material 200' (as shown with the arrow in the figure) that is fixed by using the die 142 and the fixing member 143. FIG. 5B is a view schematically illustrating a moment when the punch 141 punches the lead frame raw material 200' so that the lead supporting unit 250 is removed.

As illustrated in FIG. 5A, a step portion 142a is formed on a portion of the die 142. A height of the step portion 142a is formed to be corresponding to a depth of the half etching portions BH that is formed in the portion of the lower surface BO of the lead frame raw material 200' so that the die 142 and the lower surface BO of the lead frame raw material 200' are more closely attached to each other. Then, it is possible to prevent the lead frame raw material 200' that is supported by the die 142 and the fixing member 143 from moving during the pressing process so that the lead raw material 200' is processed more precisely.

According to the exemplary embodiment, the step portion 142a is formed on the portion of the die 142, but is not limited thereto. As described above, when the half etching portions BH is not formed in the portion of the lead frame raw material 200', the die 142 may not include the step portion 142a, and may have a flat shape. Alternatively, the punch 141 may be formed to have a step portion regarding the half etching portions BH.

Figure 6:
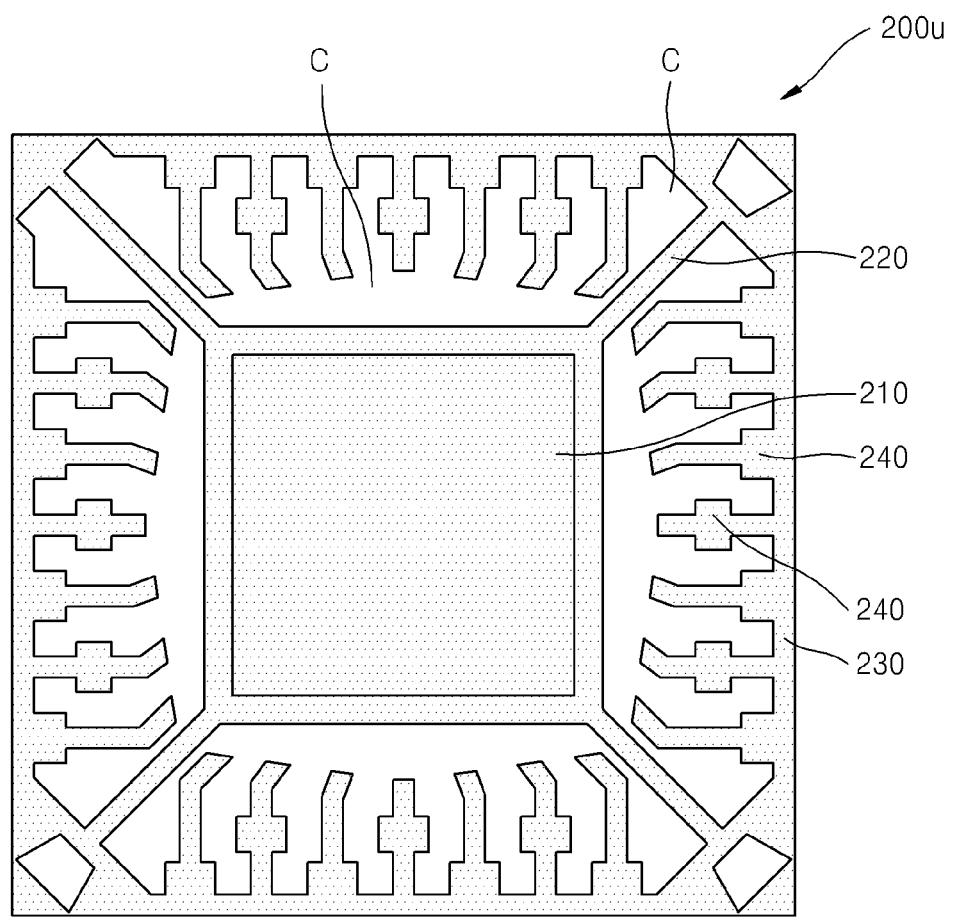
FIG. 6 is a plan view schematically illustrating the unit of the lead frame raw material at a point IV of FIG. 1 according to an exemplary embodiment.

FIG. 6 is a plan view schematically illustrating a completed unit 200u of the lead frame raw material 200' that has passed through the press working unit 140 at a point IV as shown in FIG. 1. At the point IV, the lead supporting unit 250 of the lead frame raw material 200' has been removed.

Next, after the lead supporting unit 250 has been removed by the press working unit 140, the lead frame raw material 200' is cut into strips by the strip cutting unit 150 (operation S5), and thus, is separated to form the lead frame 200 having the strip shape, as illustrated in FIG. 7. FIG. 7 is a plan view schematically illustrating the lead frame 200 at a point V of FIG. 1.

The strip cutting unit 150 cuts the lead frame raw material 200' into strips by press working or sawing, and forms the lead frame 200 having the strip shape. The plurality of completed units 200u that make up the lead frame 200 are respectively disposed in semiconductor packages.

According to the exemplary embodiment, after passing through the press working unit 140, the lead frame raw material 200' is cut into strips by the strip cutting unit 150, and thus is formed into the lead frame 200 having the strip shape. However, exemplary embodiments are not limited thereto. That is, the press working unit 140 may not only perform a process of removing the lead supporting unit 250, but simultaneously, may perform a process of cutting the lead frame material 200' into the strips. Also, according to an exemplary embodiment, after passing through the press working unit 140, the lead frame raw material 200' may not undergo the process of cutting into strips, and may be retrieved by being wound up by a retrieving roll.

Figure 9:
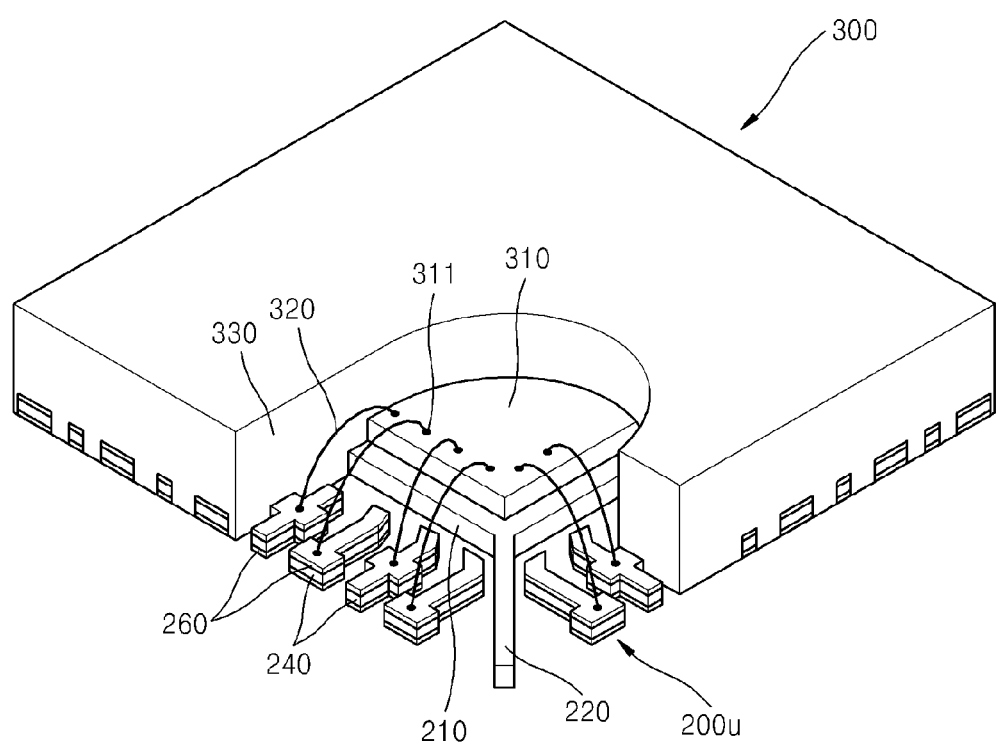
FIG. 9 is a partially cut perspective view illustrating a quad-flat no-leads (QFN) package which includes the lead frame according to an exemplary embodiment.

A semiconductor package manufacturer receives the lead frame 200 having the strip shape, performs a packaging process, and cuts into individual packages. Then, the completed unit 200u of the lead frame 200 is disposed in each semiconductor package. FIG. 9 is a partially cut perspective view illustrating a semiconductor package 300 that is finally completed.

The semiconductor package 300 of FIG. 9 is a quad-flat no-leads (QFN) package, and the completed unit 200u of the lead frame 200 that is a dual-row type is disposed inside the semiconductor package 300.

The semiconductor package 300 includes the semiconductor chip 310 that is disposed on the die pad 210, the conductive wires 320 that connect a pad 311 of the semiconductor chip 310 to the leads 240, and a mold resin 330 that molds the semiconductor chip 310, the conductive wires 320 and portions of the lead frame 200.

Here, the conductive wires 320 are formed by using Au, but are not limited thereto. That is, the conductive wires 320 according to exemplary embodiments may be formed by using a material having excellent electric conductivity, and the material is not specifically limited.

According to the exemplary embodiment, the mold resin 330 includes an epoxy material. However, a material of the mold resin 330 is not limited thereto, and may be any material that is nonconductive and can protect the semiconductor chip, etc.

In the method of manufacturing the lead frame 200 according to an exemplary embodiment, during a shape forming process, the lead supporting unit 250 of which both ends are fixed to the die pad supporting unit 220 and which connects the other ends of the leads 240, is formed so that the leads 240 are fixed. Then, the plating process for forming the plating layer 260 is performed, and the lead supporting unit 250 is removed after the plating process. Accordingly, due to the lead supporting unit 250, respective spaces between the leads 240 are not easily changed during the plating process, and thus, it is possible to prevent short-circuit even when the leads 240 are densely arranged. Therefore, it is possible to manufacture the lead frame 200 having high quality, and to manufacture multi-row lead frames in which the leads 240 are densely disposed.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While exemplary embodiments have been particularly shown and described above, it will be understood by those of ordinary skill in the art that various changes may be made therein without departing from the spirit and scope of the inventive concept as defined by the following claims.

What is claimed is:

1. A method of manufacturing a lead frame, the method comprising:
    preparing a lead frame raw material;
    forming openings in the lead frame raw material so that the lead frame material comprises:
        a die pad;
        a die pad supporting portion supporting the die pad;
        a rail portion supporting the die pad supporting portion;
        a lead supporting portion having both ends fixed to the die pad supporting portion; and
        a plurality of leads having a first end connected to the rail portion and a second end connected to the lead supporting portion;
    plating the lead frame raw material having the openings with a plating layer;
    removing the lead supporting portion; and
    forming half etching portions on a surface of the lead frame raw material,
    wherein the removing the lead supporting portion comprises:
        moving the punch from an opposite surface of the surface having the half etching portions towards the surface having the half etching portions; and
        removing the lead supporting portion.

2. The method of claim 1, wherein the removing the lead supporting portion comprises pressing the lead frame raw material by a press working unit,
    wherein the press working unit comprises:
        the punch configured to move in a straight line; and
        a die configured to support the lead frame raw material.

3. The method of claim 2, wherein the die comprises a step portion.

4. A method of manufacturing a lead frame, the method comprising:
    preparing a lead frame raw material;
    forming openings in the lead frame raw material so that the lead frame material comprises:
        a die pad;
        a die pad supporting portion supporting the die pad;
        a rail portion supporting the die pad supporting portion;
        a lead supporting portion having both ends fixed to the die pad supporting portion; and
        a plurality of leads having a first end connected to the rail portion and a second end connected to the lead supporting portion;
    plating the lead frame raw material having the openings with a plating layer;
    removing the lead supporting portion; and
    forming half etching portions on a surface of the lead frame raw material,
    wherein the removing the lead supporting portion comprises:
        moving a punch from the surface having the half etching portions towards an opposite surface of the surface having the half etching portions; and
        removing the lead supporting portion.

5. The method of claim 4, wherein the die comprises a step portion.

* * * * *